(12) United States Patent
Chakraborty et al.

(10) Patent No.: US 11,412,632 B2
(45) Date of Patent: Aug. 9, 2022

(54) ISOLATED POWER SMART TERMINAL BLOCK

(71) Applicant: Rockwell Automation Asia Pacific Business Center Pte. Ltd., Singapore (SG)

(72) Inventors: Rajiv Chakraborty, Singapore (SG); Soon Seng Kang, Singapore (SG); Srinivasan Melkote, Singapore (SG); Przemyslaw Plesowicz, Katowice (PL); Rosh Chathoth Sreedharan, Singapore (SG); Yedi Supriadi, Singapore (SG)

(73) Assignee: Rockwell Automation Asia Pacific Business Center Pte. Ltd., Singapore (SG)

( * ) Notice: Subject to any disclaimer, the term of this patent is extended or adjusted under 35 U.S.C. 154(b) by 0 days.

(21) Appl. No.: 16/437,485

(22) Filed: Jun. 11, 2019

(65) Prior Publication Data

US 2020/0396857 A1 Dec. 17, 2020

(51) Int. Cl.
*H05K 7/14* (2006.01)
*H01R 9/24* (2006.01)

(52) U.S. Cl.
CPC .......... *H05K 7/1482* (2013.01); *H01R 9/245* (2013.01); *H01R 9/2433* (2013.01); *H05K 7/1465* (2013.01); *H05K 7/1469* (2013.01); *H05K 7/1484* (2013.01)

(58) Field of Classification Search
CPC ....................................................... G05F 1/66
See application file for complete search history.

(56) References Cited

U.S. PATENT DOCUMENTS

| 5,641,313 | A | 6/1997 | Hohorst |
| 5,984,734 | A | 11/1999 | Piper et al. |
| 10,194,553 | B1 | 1/2019 | Chakraborty et al. |
| 2012/0057307 | A1* | 3/2012 | Kang ................... H01R 9/2416 |
| | | | 361/728 |
| 2018/0233885 | A1* | 8/2018 | Onishi ...................... H02J 3/02 |

FOREIGN PATENT DOCUMENTS

| EP | 3 018 983 A2 | 5/2016 |
| EP | 3 484 253 | 5/2019 |

OTHER PUBLICATIONS

European Search Report, dated Oct. 9, 2020, in connection with EP Application No. EP 20 17 9225.

* cited by examiner

*Primary Examiner* — Jerry Wu
(74) *Attorney, Agent, or Firm* — Fay Sharpe LLP

(57) ABSTRACT

A modular I/O device includes a terminal base with a terminal block that includes a plurality of wiring connectors. An auxiliary wiring device includes a plurality of auxiliary wiring connectors and is selectively physically connectable to the terminal base in an operative position and selectively physically removable from the terminal base. The terminal block and auxiliary wiring connector can be coupled to an I/O module. One or more of the I/O module terminal block and auxiliary wiring connector can include electrical or electronic components included converters, fuses, switches, etc.

4 Claims, 7 Drawing Sheets

ISOLATED POWER SMART TERMINAL BLOCK

BACKGROUND INFORMATION

Modular input/output (I/O) systems for industrial automation control systems are well-known and in widespread use. Referring to FIG. 1, a known modular I/O system MIO' includes a network adapter module AM' that is operatively connected to an industrial automation network N so that the network adapter module AM' receives data from, transmits data to, and otherwise communicates with an industrial control module or "controller" C also connected to the network N.

The adapter module AM' is mounted to a DIN rail D or other support structure. One or more terminal base units TB' (TB1',TB2',TB3', etc.) are also mounted to the DIN rail D, with a first terminal base unit TB1' located adjacent and operably physically and electrically connected to the network adapter module AM' and with the additional terminal base units TB2',TB3' operably physically and electrically connected together one after the other in a sequential manner such that a modular backplane circuit for communicating electrical power and data (referred to as a "backplane") is constructed through the successively connected terminal base units TB' and operably connects each terminal base unit TB' to the adapter module AM' and, thus, to the controller C.

Each terminal base unit TB' (sometimes referred to simply as a "terminal base") includes a terminal block BK' comprising a plurality of cage clamps, spring clamps, screw terminals, or other wiring connectors WC' that are adapted to be connected to field cables or field wires FW that are each associated with a field device FD that is typically an analog or digital device such as a sensor, switch, probe, thermocouple, RTD, encoder, or the like that is associated with the process or machine being controlled (the controlled system CS) by the controller C. The terminal block BK' is typically a separate structure that is assembled to the terminal base TB' but the terminal block BK' can alternatively be defined as an integral or one-piece part of the terminal base TB'. Different varieties of terminal blocks BX' can be used depending upon the particular configuration required for the field device wiring connectors WC', with some having different common terminals, ground connections, voltage supply terminals, and the like.

A respective I/O module M' is operatively removably connected to each terminal base TB' such that the installed I/O module M' communicates with the field device wiring connectors WC' of the corresponding terminal base TB' to which the I/O module M' is physically connected, and the I/O module M' also communicates with the network adapter module AM' (and from there to the industrial automation controller C) over the backplane circuit such that input/output data is provided between the controller C and field device(s) FD connected to the corresponding terminal base TB'. Each I/O module M' is selected and configured to perform one or more specialized input/output functions such as DC input, DC output, AC input, AC output, analog input and/or output, RTD and/or thermocouple input and/or thermocouple output, or the like.

In certain instances, a terminal block BK' lacks the required number and/or type of wiring connectors WC' necessary to complete the wiring for one or more associated field devices FD. In such case, using presently known systems, it is necessary for an end user to install a separate auxiliary wiring connector device XD' as near as possible to the relevant terminal base TB'. In this known arrangement, the auxiliary wiring connector device XD' is separate and spaced-apart from the terminal block BK' and is provided with the necessary power, ground, or other auxiliary wiring connections XC'. One or more of the auxiliary wiring connectors XC' is connected to an auxiliary input or output connection AX such as a ground path, a voltage supply, a conditioning circuit, or the like. The field device wiring or related cabling/wiring must be lengthened and/or otherwise routed to mate with the wiring connections XC' of the separate auxiliary wiring device XD' (see field wires FW') which makes the wiring system more complicated and less efficient. Also, the use of such a separate auxiliary wiring connector device XD' makes it more difficult for maintenance and service personnel to understand the original wiring pattern and to duplicate same as needed after removal and replacement of a defective terminal base TB'.

In addition, the power that can be supplied to the auxiliary wiring device from the I/O module M' is generally limited due to power/heat dissipation requirements of the I/O module M'. As power requirements often increase with use of the auxiliary wiring device, there can be certain configurations/installations where insufficient power is available for all components to be wired to the auxiliary wiring device XD'.

SUMMARY

A need has been identified for an auxiliary wiring device that overcomes these and other deficiencies while providing better overall results.

In accordance with one aspect of the present disclosure, a modular I/O system comprises at least one of a terminal base including a terminal block, and an auxiliary wiring device, wherein the at least one of the terminal base including a terminal block or auxiliary wiring device includes at least one electrical or electronic component adapted to be connected to an associated field device.

The at least one electrical or electronic device component can include a power converter, a fuse, or a knife disconnect. The terminal block can include a plurality of wiring connectors adapted for connection to associated field device wires, and the auxiliary wiring device can include a plurality of auxiliary wiring connectors adapted for connection to associated field device wires, said auxiliary wiring device can be selectively physically connectable to said terminal base in an operative position and selectively physically removable from said terminal base. The terminal block can include a receiver and said auxiliary wiring device can include a body having at least one mounting tab that projects outwardly from the body, wherein said at least one mounting tab is located in said receiver when said auxiliary wiring device is connected to said terminal base. The receiver can include an open pocket into which said at least one mounting tab is inserted when said auxiliary wiring device is connected to said terminal base. The at least one electrical or electronic device component can include a power converter, and the system can further include an external power source connected directly to the at least one terminal base including a terminal block or auxiliary wiring device for supplying a prescribed power signal to an associated field device. The system can include an I/O module in communication with the associated field device. The electrical or electronic device can be embedded within the at least one of the terminal base including a terminal block or auxiliary wiring device.

In accordance with another aspect of the present disclosure, a terminal block for use with an associated modular I/O system having a terminal base and an I/O module is set forth wherein the terminal block includes at least one electrical or electronic component adapted to be connected to an associated field device.

The terminal block can include a plurality of wiring connectors adapted for connection to associated field device wires, and the at least one electrical or electronic device component includes a power converter for supplying a prescribed power signal to an associated field device. The at least one electrical or electronic device component can include a circuit breaking devices for disconnecting the associated field device from the associated modular I/O system. The circuit breaking device can include a knife disconnect, and the knife disconnect can be supported within the terminal block and accessible for actuation from an exterior of the terminal block.

In accordance with another aspect of the present disclosure, an auxiliary wiring device for use with an associated modular I/O system having a terminal base supporting a terminal block, and an I/O module is set forth, The auxiliary wiring device comprises at least one electrical or electronic component adapted to be connected to an associated field device wherein the auxiliary wiring device includes a plurality of auxiliary wiring connectors adapted for connection to associated field device wires, said auxiliary wiring device selectively physically connectable to said terminal base of the associated modular I/O system in an operative position and selectively physically removable from said terminal base of the associated modular I/O system.

The auxiliary wiring device can include a body having at least one mounting tab that projects outwardly from the body adapted to be received in a receiver of the terminal block of the associated modular I/O system when said auxiliary wiring device is connected to said terminal base. The at least one electrical or electronic device component can include a power converter. The at least one electrical or electronic device component can include a circuit breaking device for disconnecting an associated field device from the associated modular I/O system. The circuit breaking device can include a knife disconnect. The knife disconnect can be supported within the terminal block and accessible for actuation from an exterior of the terminal block.

DETAILED DESCRIPTION

Figure 1:
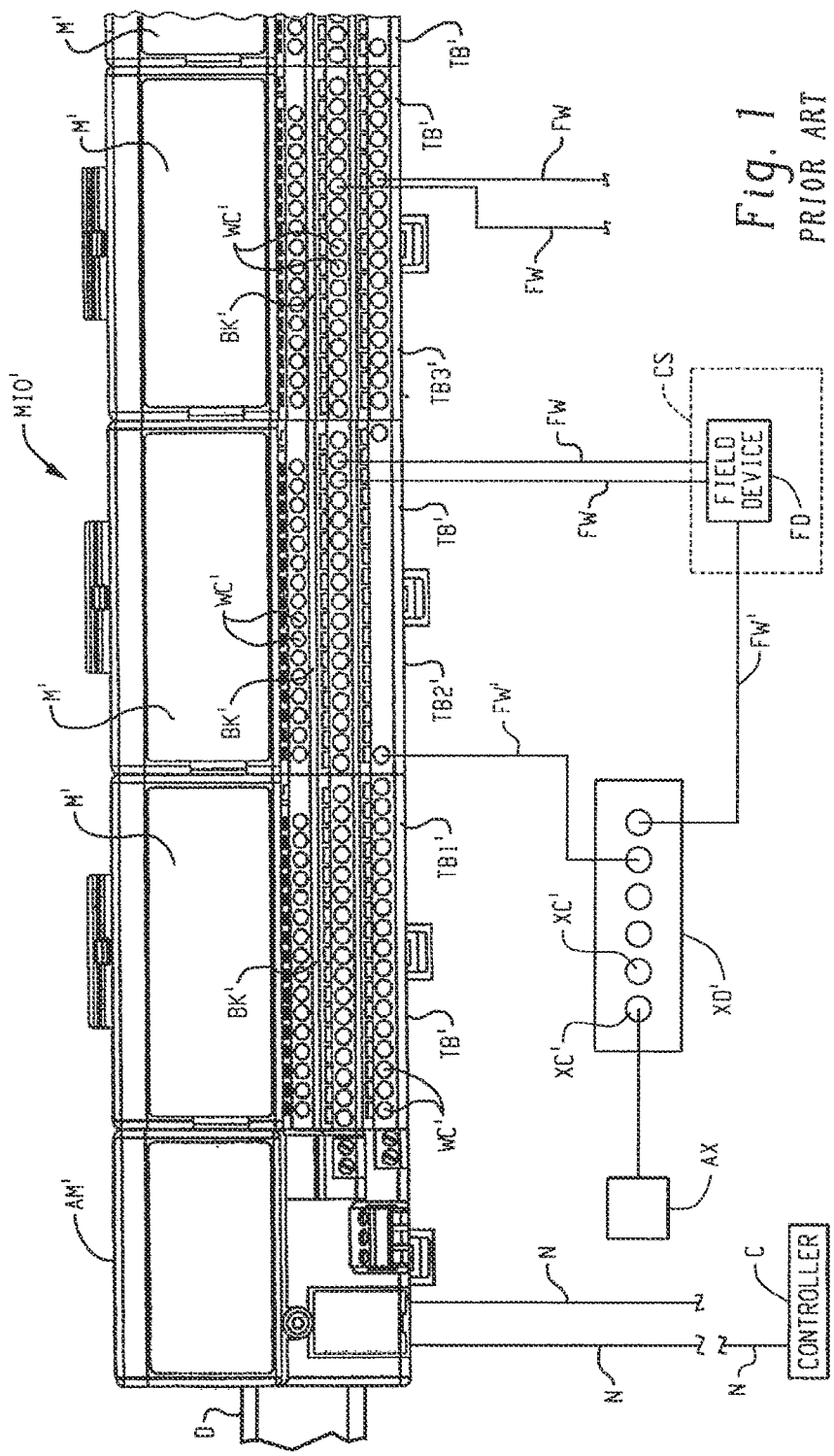
FIG. 1 (prior art) is a front view of a known modular input/output (I/O) system.
Figure 2:
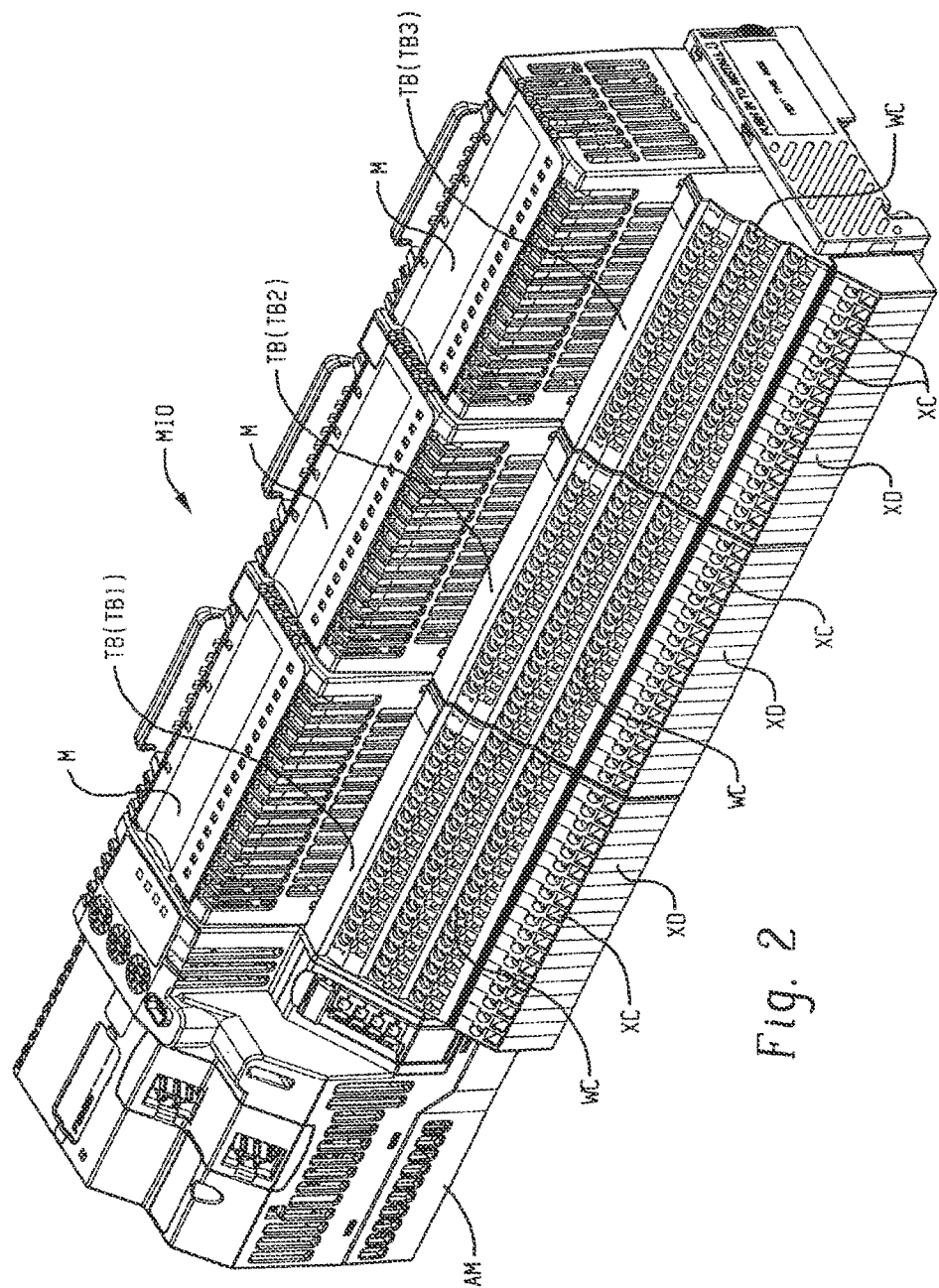
FIG. 2 is an isometric view of a modular input/output (I/O) system provided in accordance with an embodiment of the present development to include at least one selectively installable and removable auxiliary wiring device.

FIG. 2 is an isometric view of a modular input/output (I/O) system MIO including at least one selectively installable and removable auxiliary wiring device XD in accordance with an embodiment of the present development. Except as otherwise shown and/or described herein, the modular I/O system MIO of FIG. 2 is similar to the modular I/O system MIO' of FIG. 1, and like components of the modular I/O system MIO relative to the modular I/O system MIO' of FIG. 1 are identified with like reference characters that omit the primed (') designation, and in some cases such like components are not described in their entirety again here.

The modular input/output (I/O) systems MIO includes a network adapter module AM and includes one or more terminal base units TB (TB1,TB2,TB3, etc.) operably connected to the adapter module AM. The adapter module AM is operatively connected to an industrial automation network N (FIG. 1) so that the network adapter module AM receives data from, transmits data to, and otherwise communicates with an industrial control module or "controller" C also connected to the network N. A first terminal base unit TB1 is located adjacent and operably physically and electrically connected to the network adapter module AM and the additional terminal base units TB2,TB3 are operably physically and electrically connected together one after the other in a sequential manner such that a modular backplane circuit for communicating electrical power and data (referred to as a "backplane") is constructed through the successively connected terminal base units TB and operably connects each terminal base unit TB to the adapter module AM and, thus, to the associated industrial controller C to which the adapter module AM is operable connected.

Figure 3:
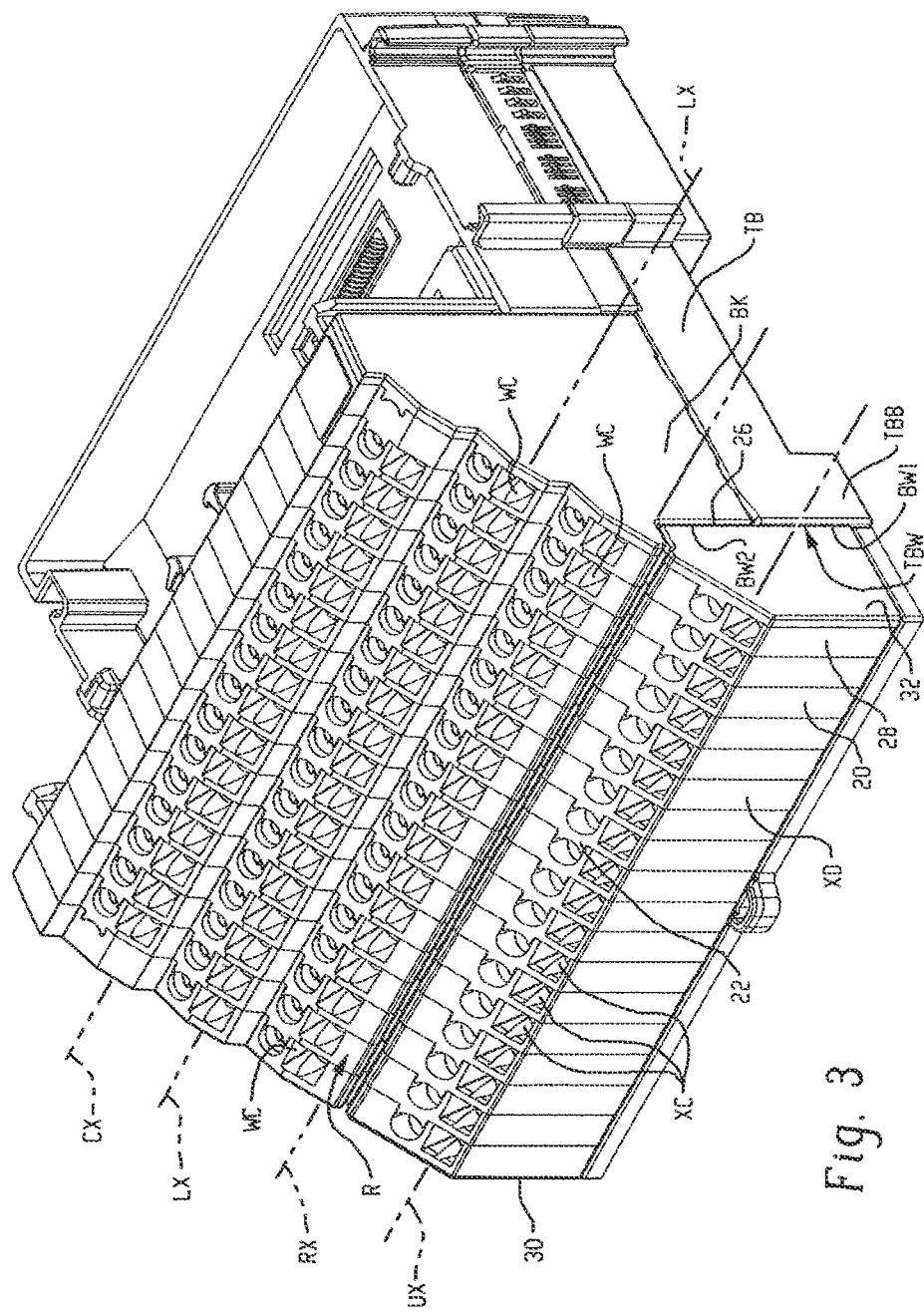
FIG. 3 is an isometric view of a single terminal base of the I/O system of FIG. 2 (without including its associated I/O module connected thereto) including a selectively installable and removable auxiliary wiring device according to the present development.
Figure 4:
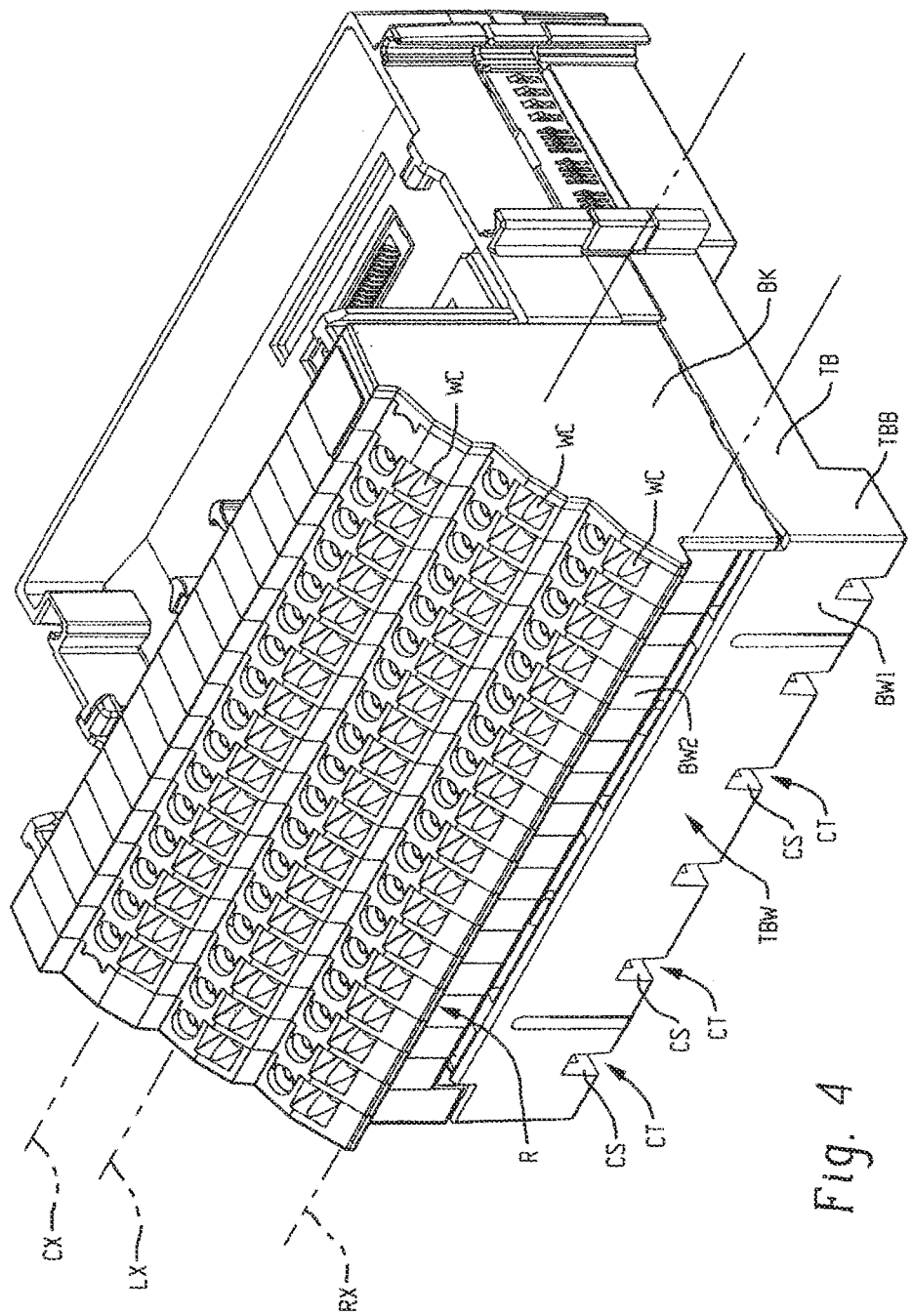
FIG. 4 is similar to FIG. 3 but shows the terminal base without the auxiliary wiring device installed.

Referring also to FIGS. 3 & 4, each terminal base unit TB (sometimes referred to simply as a "terminal base") includes a main body TBB and includes a terminal block BK that is connected to the main body TBB or that is defined as a part of the main body TBB. The terminal block BK comprises a plurality of cage clamps, spring clamps, screw terminals, or other wiring connectors WC that are adapted to be connected to field cables or field wires FW that are each associated with a field device FD that is typically an analog or digital device such as a sensor, switch, probe, thermocouple, RTD, encoder, or the like that is associated with the process or machine being controlled (the controlled system CS) by the controller C (see also FIG. 1). The wiring connectors WC are arranged in respective rows that each extend laterally along a connector axis CX that lies parallel to a longitudinal axis LX of the terminal block BK, and the longitudinal axis LX of the terminal block typically lies parallel to the DIN rail or other mounting structure to which the terminal base TB is operatively connected during use. As shown in FIG. 4, the terminal base TB comprises a bottom wall TBW that partially defined by a bottom wall BW1 of the main body TBB and partially defined by a bottom wall W2 of the terminal block BK.

A respective I/O module M (shown in FIG. 2 but not in FIGS. 3 & 4) is operatively removably connected to each terminal base TB such that the installed I/O module M communicates with the field device wiring connectors WC of the corresponding terminal base TB to which the I/O module M is physically connected, and the I/O module M also communicates with the network adapter module AM (and from there to the industrial automation controller C) over the backplane circuit such that input/output data is provided between the controller C and field device(s) FD connected to the corresponding terminal base TB. Each I/O module M is selected and configured to perform one or more specialized input/output functions such as DC input, DC output, AC input, AC output, analog input and/or output, RTD and/or thermocouple input and/or thermocouple output, or the like.

As noted above, in certain instances, a terminal block BK lacks the required number and/or type of wiring connectors WC necessary to complete the wiring for one or more associated field devices FD. The system MIO of FIG. 2 further includes at least one selectively installable and removable auxiliary wiring device XD that, when installed as shown in FIGS. 2 and 3, is mechanically or physically engaged with and connected to a corresponding terminal base TB. The auxiliary wiring device XD comprises a plurality of auxiliary wiring connectors XC for being connected to one or more of the field wires FW and/or for being connected to an auxiliary input or output connection AX (FIG. 1) such as a ground path, a voltage supply, a conditioning circuit, or the like. In one embodiment, all of the auxiliary wiring connectors XC are electrically connected in common with each other such that a connection of one of the auxiliary wiring connectors XC to the auxiliary input or output connection AX (e.g., an electrical ground path connection) connects all of the auxiliary wiring connectors XC to the auxiliary input or output connection. In an alternative embodiment, at least one of the auxiliary wiring connectors XC is not electrically connected in common with the other auxiliary wiring connectors XC. As shown in FIG. 4, the auxiliary wiring device XD is selectively removable from the terminal base TB when not needed or desired. Further details of the auxiliary wiring device XD are set forth in U.S. Pat. No. 10,194,553, which is hereby incorporated herein by reference in its entirety.

Figure 5:
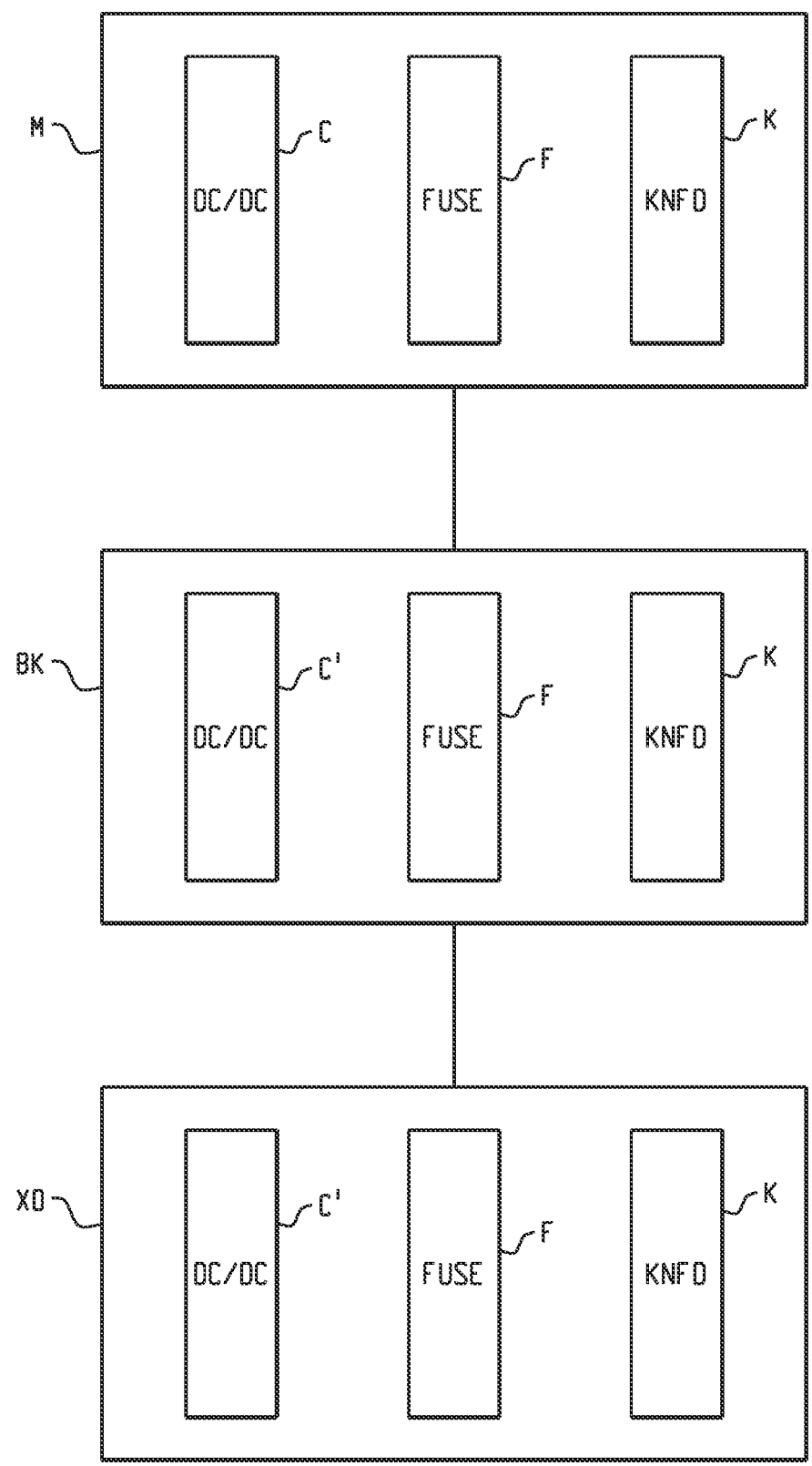
FIG. 5 is a schematic illustration of components of an I/O system in accordance with the present disclosure.

Turning to FIG. 5, and in accordance with the present disclosure, at least one of the I/O module M, terminal block BK and/or auxiliary wiring device XD can include an electrical or electronic component for enhancing overall functionality of the system MIO. For example, the I/O module is shown with a DC to DC converter C (active component) for supplying a particular DC voltage to a field device, such as a three-wire actuator, (not shown) or to the terminal block BK or auxiliary wiring device XD. In applications where it would be undesirable to house the DC to DC converter in the I/O module, a DC to DC converter C' is provided in the terminal block BK and/or in the auxiliary wiring device XD. As noted above, providing a DC/DC converter C' in the terminal block BK or in the auxiliary wiring device XD can avoid thermal issues that may otherwise arise if the DC to DC converter is provided in the I/O module M, and can allow for a larger overall power supply than would be available directly from the I/O module itself.

Other electrical devices can also be included in any of the I/O module M, terminal block BK and auxiliary wiring device XD. For example, a fuse F (passive component) can be included for providing circuit protection.

In other examples, a knife disconnect K or other switch or circuit breaking device can be provided. In some application, a knife disconnect K can be particularly advantageous for allowing a circuit/field device to be deenergized for service without requiring physically disconnecting one or more wires or cables from the particular circuit/field device. In the past, a technician would typically be required to physically disconnect and then reconnect one or more field devices from the system MIO by detaching and reattaching wires from the terminal block BK, for example. This presented a constant source of failure as any detached wires could inadvertently be reattached incorrectly. By a providing knife disconnect in one or more of the I/O module M, terminal block BK or auxiliary wiring device XD, any external component can be readily disconnected for servicing without disconnecting any wiring.

Figure 6:
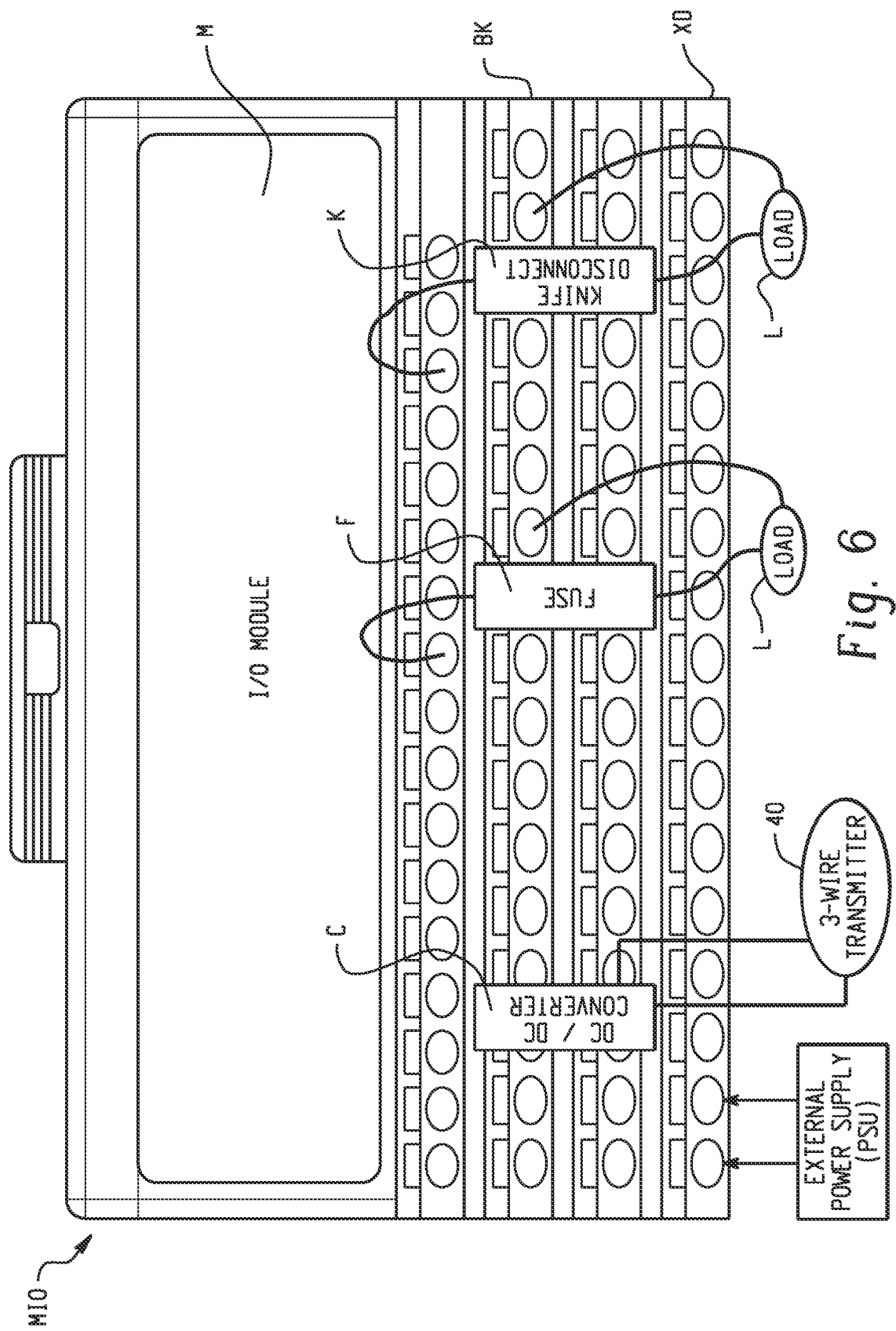
FIG. 6 is a schematic illustration of an exemplary terminal block in accordance with the present disclosure.

FIG. 6 illustrates one exemplary embodiment of an input/output (I/O) systems MIO in accordance with the present disclosure wherein electrical/electronic components are included in a terminal block BK. In this example, the terminal block BK is configured with a DC to DC converter C for supplying power to a field device such as a three-wire transmitter 40 as shown, or any other field device such as a sensor or actuator. To this end, an external power supply unit PSU is connected to the terminal block TB for provided the auxiliary power to the three-wire transmitter 40 and/or other components directly from the terminal block TB (not from the I/O module M). In one example, the DC to DC converter C is used to supply 24 v, 200 mA, (as compared to an isolated power source from conventional I/O module of 24 v, 25 mA per channel). In some examples, the DC to DC converter C can provide multiple channels (e.g., 24 v, 200 mA) while maintaining input to output isolation requirements of the terminal block TB. This can be advantageous particularly for three wire sensors and/or HART actuators that typically have a higher power requirement than a typical 24 v/25 mA I/O module channel and require a return wiring for signal transmission. Accordingly, the terminal block TB can satisfy higher power requirements of auxiliary devices without negative thermal consequence to the I/O module M.

Also shown in FIG. 6 embedded in the terminal block BK is a fuse F wired in series with a load L, and a knife disconnect K wired in series with a load L. The term embedded smart blocks is intended to cover any type of electrical component or electronic component embedded or otherwise supported by the terminal block TB.

It should be appreciated that the terminal block TB in accordance with the present disclosure can be considered a smart terminal block in that it no longer simply acts as a device for joining conductors. In the past, any disconnects, fuses, converters etc. would typically be wired separately into any circuit attached to a terminal block. Not only did this create more work for an installer, but it created more points of failure. The terminal block TB of the present disclosure reduces installation time, increases overall system capabilities, and reduces or eliminates wiring mistakes during servicing. The terminal block TB is an external attachment that can be added to any terminal base (e.g., retrofit), making the smart terminal block useful for, among other things, supplying power to new configurations and types of sensors/actuators with increased power demands. In addition, in applications where the power source can be off-loaded to the terminal block TB from the I/O module M, power dissipation requirements of the I/O module can be decreased.

It should further be appreciated that the features of the terminal block TB of FIG. 6 could similarly be included in either or both of the I/O module M or the auxiliary wiring device XD, and field devices could be similarly wired to the I/O module M or auxiliary wiring device XD.

Figure 7:
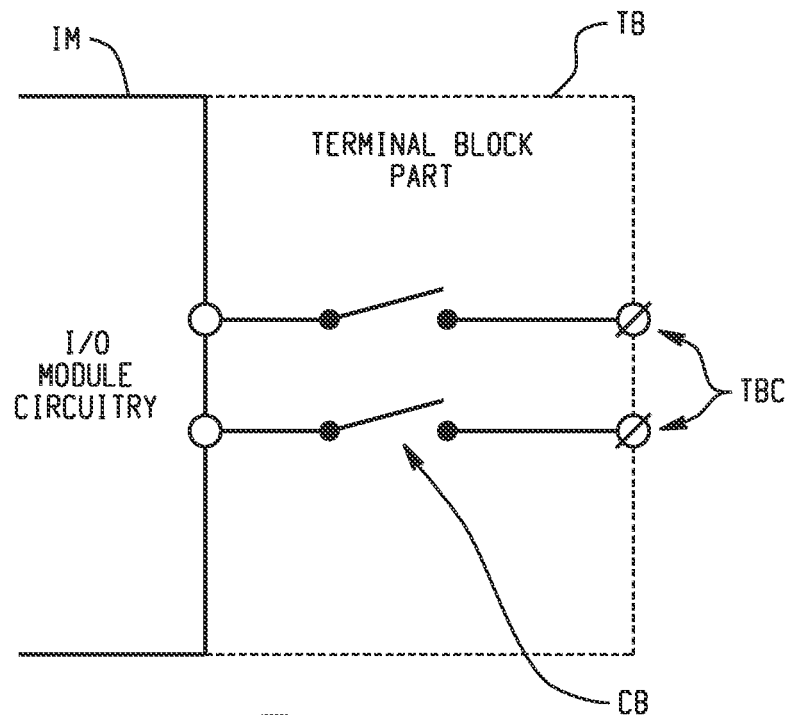
FIG. 7 is electrical schematic diagram of an exemplary modular I/O system in accordance with the present disclosure.

With reference to FIG. 7, an electrical schematic diagram illustrating a circuit breaking element CB in a terminal block TB of a module I/O device having an I/O module IM is shown. As evident, the circuit breaking element CB allows breaking a circuit wired to a terminal block connector TBC.

The circuit breaking element CB can be a knife disconnect, or any other type of device for breaking the circuit. In one example, the circuit breaking element CB is accessible from an exterior of the terminal block TB so that the circuit can be disconnected/connected without the need to manipulate any connecters (e.g., the terminal block connector TBC).

Figure 8:
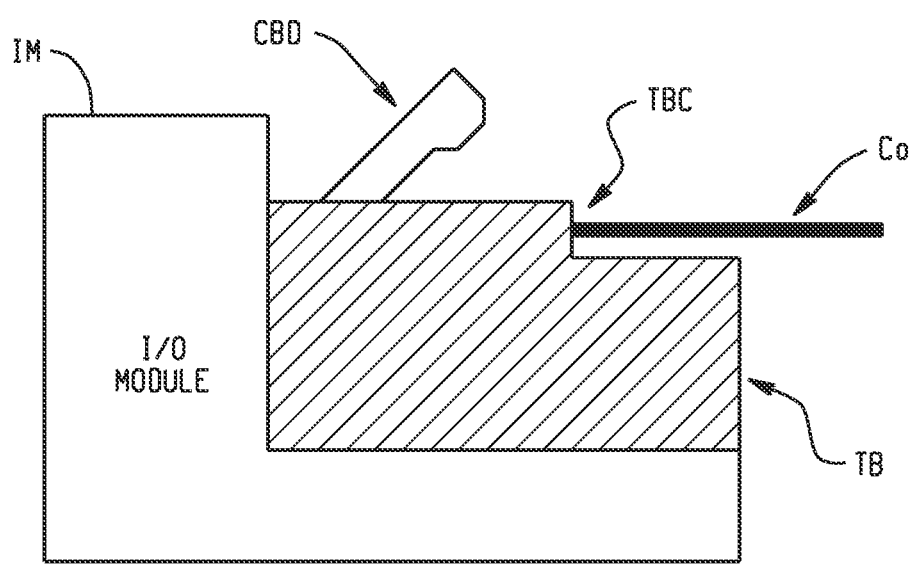
FIG. 8 is a block diagram of an exemplary I/O system in accordance with the present disclosure.

FIG. 8 is a block diagram illustrating the I/O module IM, terminal block TB and circuit breaking element CBD. A conductor Co is shown connected to the terminal block connector TBC. The conductor Co is coupled to a field device (not shown) that can be readily disconnected by opening the circuit breaking device CBD.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

The invention claimed is:

1. A modular I/O system comprising:
  at least one terminal base, the terminal base including a terminal block; and
  the terminal block of the at least one terminal base including at least one auxiliary wiring device engaged with the terminal base;
  wherein the at least one terminal base including the terminal block, or the at least one auxiliary wiring device, includes at least one electronic component adapted to be connected to an associated field device;
  wherein the at least one electronic component includes a power converter, a fuse, or a knife disconnect;
  wherein the at least one auxiliary wiring device includes a plurality of auxiliary wiring connectors adapted for connection to associated field device wires, said at least one auxiliary wiring device selectively physically connectable to said at least one terminal base in an operative position and selectively physically removable from said at least one terminal base by a user, said at least one terminal block comprises a receiver and said at least one auxiliary wiring device comprises a body including at least one mounting tab that projects outwardly from the body, wherein said at least one mounting tab is located in said receiver when said at least one auxiliary wiring device is connected to said at least one terminal base, said receiver comprises an open pocket into which said at least one mounting tab is inserted when said at least one auxiliary wiring device is connected to said at least one terminal base, and an I/O module operatively removably connected to the at least one terminal base and in communication with the associated field device through the corresponding auxiliary wiring device, and a network adapter module selects and controls the I/O module configured to perform input/output functions through the terminal block and the at least one auxiliary wiring device.

2. The modular I/O system as set forth in claim 1, wherein the at least one electronic component includes the power converter, and further comprising an external power source connected directly to the at least one terminal base including a terminal block or the at least one auxiliary wiring device for supplying a prescribed power signal to an associated field device.

3. The modular I/O system as set forth in claim 1, wherein the at least one electronic component is embedded within the at least one terminal base including a terminal block or the at least one auxiliary wiring device.

4. The modular I/O system as set forth in claim 1, further comprising field wiring connecting the at least one terminal base including a terminal block or the at least one auxiliary wiring device to an associated field device.

* * * * *